United States Patent [19]
Yamazaki et al.

[11] Patent Number: 6,001,432
[45] Date of Patent: Dec. 14, 1999

[54] APPARATUS FOR FORMING FILMS ON A SUBSTRATE

[75] Inventors: Shunpei Yamazaki, Tokyo; Kenji Itoh, Kanagawa, both of Japan

[73] Assignee: Semiconductor Energy Laboratory Co., Ltd., Kanagawa, Japan

[21] Appl. No.: 08/911,914

[22] Filed: Aug. 15, 1997

Related U.S. Application Data

[62] Division of application No. 08/585,742, Jan. 16, 1996, abandoned, which is a continuation of application No. 08/153,923, Nov. 17, 1993, abandoned.

[30] Foreign Application Priority Data

Nov. 19, 1992 [JP] Japan .................................. 4-333606

[51] Int. Cl.[6] .................................................. C23C 16/00
[52] U.S. Cl. ...................... 427/577; 427/569; 118/723 E; 118/729
[58] Field of Search ........................... 118/723 E, 723 R, 118/718, 729; 427/577, 569

[56] References Cited

U.S. PATENT DOCUMENTS

| | | | |
|---|---|---|---|
| 4,534,816 | 8/1985 | Chen | 145/345 |
| 4,578,559 | 3/1986 | Hijikata | 219/121 |
| 4,663,828 | 5/1987 | Hanak | 29/572 |
| 4,707,210 | 11/1987 | Misumi | 156/345 |
| 4,910,041 | 3/1990 | Yanagihara | 427/37 |
| 4,920,917 | 5/1990 | Nakatani | 118/718 |
| 4,991,542 | 2/1991 | Kohmura | 118/723 |
| 5,022,979 | 6/1991 | Hijkata | 204/298.33 |
| 5,203,924 | 4/1993 | Mitani | 118/719 |
| 5,266,116 | 11/1993 | Fujioka | 118/718 |
| 5,413,673 | 5/1995 | Fujimoto | 156/345 |

OTHER PUBLICATIONS

Wolf, Silicon Processing for the VLSI Era, vol. 1, Lattice Press, 1986, pp. 172–173, 544, 570–571.

*Primary Examiner*—Thi Dang
*Attorney, Agent, or Firm*—Sixbey, Friedman, Leedom & Ferguson, P.C.; Gerald J. Ferguson, Jr.; Jeffrey L. Costellia

[57] ABSTRACT

An apparatus for forming films on a substrate is described. The apparatus comprises a vacuum chamber, an evacuating system connected to the vacuum chamber for maintaining a predetermined pressure in the vacuum chamber, a power supply for generating electric energy at high frequencies, a first electrode disposed in the vacuum chamber and connected to the power supply for receiving the electric energy as a cathode, the substrate to be coated being mounted on the first electrode, a second electrode disposed in the vacuum chamber and grounded as an anode, an electric discharging region being formed between the first and second electrodes in order to generate a plasma region therebetween, and a gas feeding system connected to the vacuum chamber for feeding a reactive gas into the vacuum chamber through a gas outlet port formed on the second electrode. The first and second electrodes are located apart from each other by a distance of no wider than 10 mm thereby a high intensity plasma region is formed to make it possible to improve the deposition speed.

17 Claims, 6 Drawing Sheets

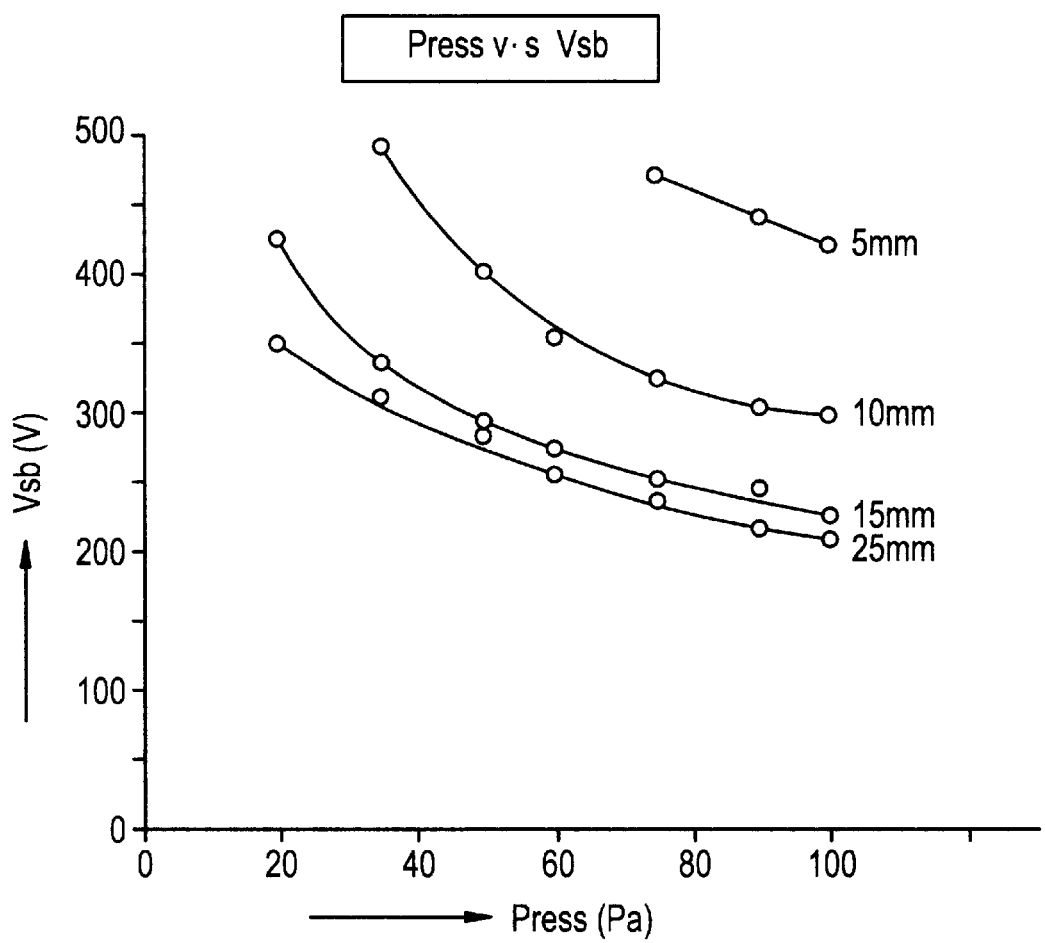

APPARATUS FOR FORMING FILMS ON A SUBSTRATE

This application is a Divisional of Ser. No. 08/585,742, filed Jan. 16, 1996, now abandoned, which is a continuation of 08/153,923 filed Nov. 17, 1993, now abandoned.

BACKGROUND OF THE INVENTION

1. Field of the Invention

The present invention relates in general to an apparatus for forming films on a substrate in a plasma.

2. Description of the Prior Art

Plasma vapor deposition apparatuses have been broadly used for forming films on substrates. Typical apparatuses of this kind comprises a reaction chamber, a pressure detecting device for detecting the pressure of the inside of the chamber, a pressure controlling device for controlling the pressure of the inside of the chamber, a pair of parallel plates between which a reaction or deposition region is defined, a gas feeding system for supplying a reactive gas, to the reaction space, a power supply for applying high frequency electric energy to the reaction gas at 13.56 MHz, a heater for heating a substrate to be coated, an evacuation system for evacuating the exhausted gas from the chamber. The parallel plates are a power supply electrode (cathode plate) connected to the power supply through a matching device, and an opposite electrode (anode plate) which is grounded.

The substrate to be coated is usually mounted on the opposite electrode grounded during plasma vapor deposition. In the case of forming films of certain materials or films having particular characteristics, e.g. carbon films having high hardnesses by means of the deposition chamber of this kind, the substrate to be coated is sometimes mounted on the power supply electrode in place of the opposite electrodes.

A self-bias potential is generated in the vicinity of the power supply electrode by virtue of the differences in mobility, mass and the like between different molecules, atoms, positive and negative ions, electrons, radicals and so forth occurring in the plasma. The ratio of the single bonds (C—C) to the double bonds (C=C) can be increased to form very hard carbon films by utilizing bombardment of positive ions on the growing carbon film in electric fields generated between the self-bias potential and the plasma potential.

The hardnesses of carbon films can be increased to the level of that of diamond also by decreasing hydrogen atoms coupled with carbon atoms to increase the proportion of the $sp^3$ hybrid orbital bonds to the hybrid orbital bonds, e.g. sp or $sp^2$.

Accordingly, it is important for forming hard carbon films to increase the above-mentioned self-bias potential. Typical and simple approaches, broadly employed in the field, for achieving this end are to decrease the pressure of the reactive gas and to increase the output power of the high frequency electric energy supplied to the reactive gas. However, the requirement of the deposition speed and reduction of the undesirable inner stress have to be compromised in this case.

The low deposition speed and the high inner stress are primary shortcomings of the plasma vapor deposition in forming carbon films. The shortcoming pose limitation on applications of this deposition technique for practical use. For example, the improvement of the deposition speed itself is possible in fact to several micrometers per minute when the quality of the film is not taken into account. When the respective parameters are optimized to achieve the qualities of deposited films, the deposition speeds are limited to 0.2 to 0.3 micrometers per minute in the case utilizing conventional hardware. The deposition speed can be improved by a factor of 1.5 by selecting appropriate reactive gases. However, this is the limit to the deposition speed at the present time.

FIG. 1 shows a conventional plasma vapor deposition apparatus. The apparatus comprises a reaction chamber 1, a pair of parallel plates 3 and 8 between which a reaction space is defined, an electrode shield 4, a gas feeding system 6 for supplying a reactive gas to the reaction space, a power supply 5 for applying high frequency electric energy to the reaction gas at 13.56 MHz, an evacuation system 7 for evacuating the exhausted gas from the chamber 1. The parallel plates are a power supply electrode 3 connected to the power supply 5 and an opposite electrode 8 grounded which are apart from each other by a relatively large distance of 20 to 50 mm, which distance is employed from the consideration of the construction of the apparatus, the stabilization of electric discharge, the uniformness of the film formed over the effective deposition area and so forth.

Because of this, the improvement of the deposition speed is achieved by the increase of the input power of high frequency energy, the increase of the pressure in the reaction space and so forth. It is, however, very difficult to increase the output power of high frequency energy since electric energy supplied can not effectively be transformed into the available high frequency electric energy in the usual wirings and the usual configuration of the electrodes, resulting in a substantial power loss. In addition to this, even if high power energy can be supplied to the reaction space, the influence of etching action prevails over that of the increase of the high frequency energy so that the deposition speed becomes sometimes reduced in spite of the increase of the high frequency energy.

The reduction of the inner stress is achieved only with a tradeoff for the increase of the hardness. Namely, when a harder film is formed, the residual inner stress is increased. In many practical cases, the advantage of the hardness is preferred to the disadvantage of the residual inner stress. In the cases where the thicknesses of films are increased to several micrometers, however, the residual inner stress poses serious problems of peeling-off, rubbing-off, decreased adhesivity and so on. A suitable technique is desired to form relatively thick films containing a decreased inner stress. With such difficult problems, very hard carbon films have been manufactured in return for low deposition speeds and high residual inner stress.

BRIEF SUMMARY OF THE INVENTION

It is an object of the present invention to provide an apparatus capable of forming films on a substrate at a high speed.

It is another object of the present invention to provide an apparatus capable of forming films on a substrate with little residual inner stress.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, an apparatus for forming films on a substrate comprises: a vacuum chamber for confining a reactive gas therein at a negative pressure; and a pair of electrodes opposed to each other with a distance of no wider than 10 mm, wherein the area of one of the electrodes serving as an anode grounded is larger than the area of the other of the electrodes serving as a cathode through which electric energy is supplied.

In accordance with another aspect of the present invention, the electrodes serving as an anode has a hollow structure formed with at least one long and narrow gas outlet port approximately in the form of a line on the electrodes serving as an anode.

In accordance with a further aspect of the present invention, the electrodes serving as an anode has a hollow structure formed with a plurality of gas outlet ports in the form of lines on the electrodes serving as an anode.

In accordance with a further aspect of the present invention, an apparatus for forming films on a substrate comprises: a vacuum chamber for confining a reactive gas therein at a negative pressure; and a pair of electrodes opposed to each other with a distance of no wider than 10 mm, wherein the substrate is supported to move relative to a plasma region in the form of a line or a point caused by means of the pair of the electrodes in order to form films on the substrate.

The distance between the pair of electrodes is very important in connection with the characterizing feature of the present invention. The distance is preferably selected to be no wider than 10 mm, preferably no wider than 5 mm and typically between 2 mm and 7 mm.

It was confirmed through experiments that the deposition speed can be improved by one or more order of magnitude by employing this structure as compared with those achieved in conventional techniques. The deposition speed in accordance with the present invention can be 2 to 5 $\mu$m/min. The residual inner stress can be lessened also by one or more order of magnitude by this structure.

Carbon films formed in accordance with the present invention suitable for use in magnetic tapes, magnetic disks, optical disks and the like as surface protection films covering the record mediums because of the excellent abrasion-proof characteristic, the high smoothness, the high hardness and so forth.

BRIEF DESCRIPTION OF THE DRAWINGS

The accompanying drawings, which are incorporated in and form a part of the invention and, together with the description, serve to explain the principles of the invention.

FIG. 3 is a graphical diagram showing the relationship of the self-bias potential with the reaction pressure and the distance between opposed electrodes.

DETAILED DESCRIPTION OF THE PREFERRED EMBODIMENTS

In accordance with the present invention, deposition by means of plasma processing can be uniformly carried out over a wide area by decreasing the distance between a pair of electrode plates for generating electric discharge inbetween. The self-bias potential is increased due to the decreased distance to generate a high intensity plasma region in the form of a line or points. The substrate to be coated is moved respective to the plasma region to accomplish uniform deposition.

The inventors reached the present invention through the several important experiments as set forth below.

Figure 1:
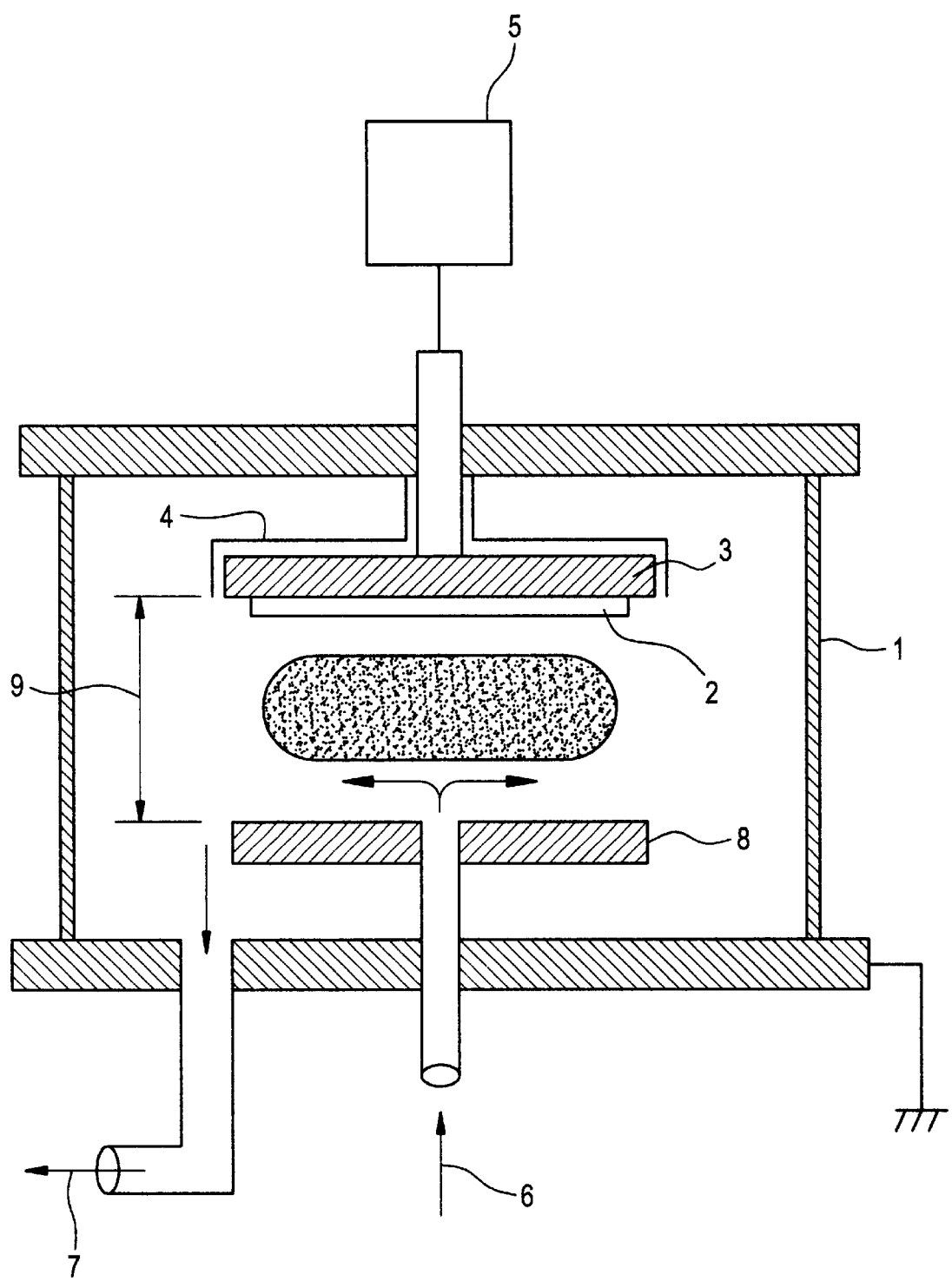
FIG. 1 is a cross sectional view showing a prior art apparatus for forming films on a substrate.
Figure 2:
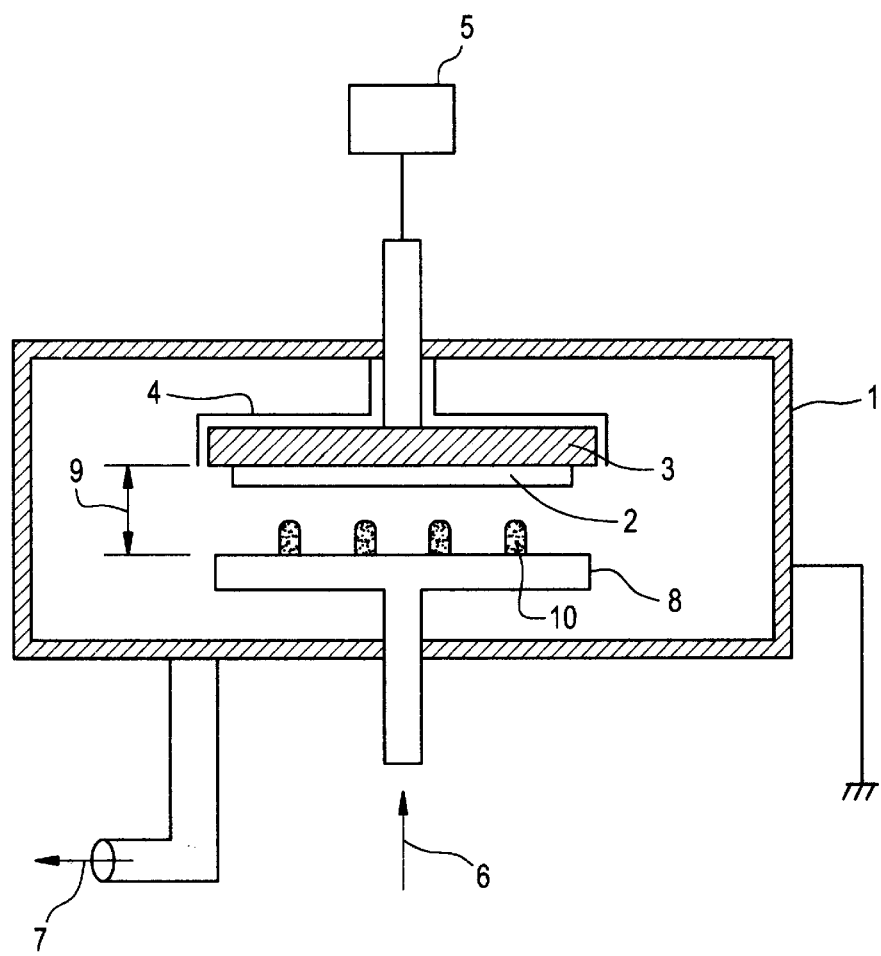
FIG. 2 is a cross sectional view showing an apparatus for forming films on a substrate.

The experiments were conducted with a plasma vapor reaction apparatus as illustrated in FIG. 2. The reaction apparatus was composed of a reaction chamber 11, a pair of parallel plates 13 and 18 between which a reaction space was defined, a gas feeding system 16 for supplying a reactive gas to the reaction space, a power supply 5 for applying high frequency electric energy to the reaction gas at 13.56 MHz, an evacuation system 17 for evacuating the exhausted gas from the chamber 11. The parallel plates were a power supply electrode 13 connected to the power supply and an opposite electrode 18 being grounded. Hydrogen was then introduced into the chamber at 200 SCCM and high frequency electric energy was applied between the pair of the electrodes 13 and 18. The reaction pressure and the self-bias potential were repeatedly measured in this condition with the distance between the pair of electrodes 13 and 18 being changed to be 5, 10, 15 and 25 mm respectively. The relationship between the reaction pressure and the self-bias potential Vsb was obtained and plotted in a graphical diagram as shown in FIG. 3.

As shown in FIG. 3, the self-bias potential was increased as the distance between the electrodes decreased or as the pressure decreased. Furthermore, when the distance was 5 mm and 10 mm and the pressure was relatively high, high intensity plasma regions 10 were observed in the vicinity of gas outlet ports formed in the grounded (anode) electrode 18.

Figure 4A:
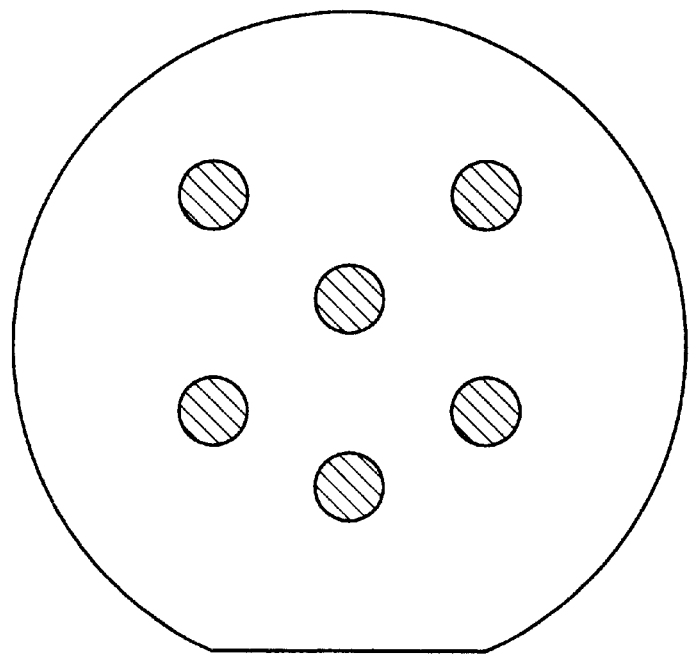
FIGS. 4(A) and 4(B) are explanatory views showing high intensity plasma regions generated in accordance with the present invention.

Next, ethylene was introduced in place of hydrogen to form a carbon film. As a result, considerable disparity of the thickness was observed depending upon the geometry of the outlet port for feeding the reactive gas. In the case that the outlet ports were circular holes with 1 mm diameter, the thickness was apparently increased in the areas 20 hatched in FIG. 4(A) in correspondence with the locations of the circular holes. When the deposition was continued for one minute at a reaction pressure of 100 Pa and with an input high frequency electric energy of 500 W, the thicknesses in the hatched areas were measured to be about 2 micrometers while the average thickness in the remaining areas was 0.2 to 0.4 micrometer. It was confirmed that the loading effect could be neglected through experiments with various deposition conditions.

The Vickers hardness of the carbon films thus deposited was measured to be from 3000 to 4000 kg/mm. It was also confirmed that the films possessed low inner stress and sufficient adhesivity to the underlying surfaces to minimize the chance of possible peeling or rubbing off.

Figure 4B:
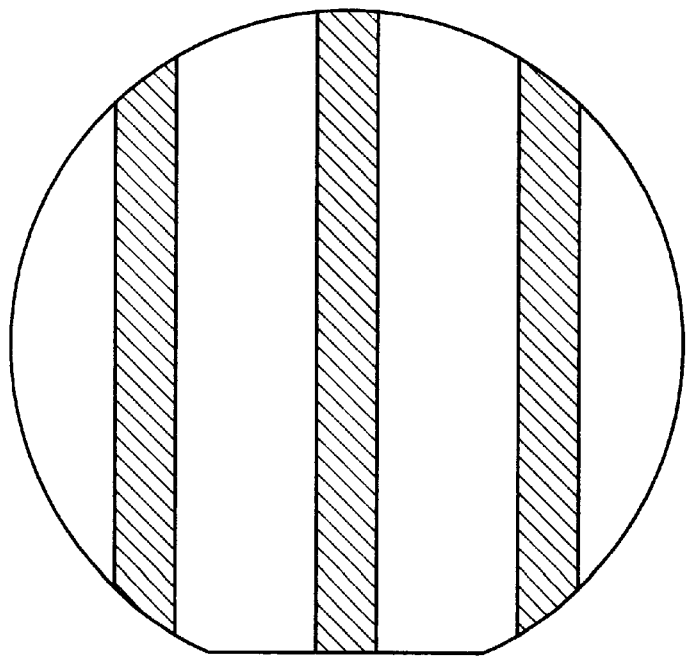

Next, the outlet ports were designed in the form of slits each having a width of 1 mm and a length of 15 cm. It was also confirmed that the thickness of the film formed in the hatched areas 20 in FIG. 4(B) was 5 to 10 times greater than that in the remaining areas.

From the experiments as set forth, it was found that the bias potential can be increased when the distance between the electrode plates was no larger than 10 mm, preferably no larger than 5 mm in which case the bias potential could be increased 2 or more times larger than those built in conventional cases. The flexibility of designing the deposition conditions can therefore be improved by this technique.

The localized high intensity discharging region (high intensity plasma regions) 10 seemed to be caused by concentrated electric fields between the pair of the electrodes 13 and 18 since the high intensity regions are formed in the vicinity of the holes or projections. From this fact, it may be possible to make the formation of the suitable high intensity plasma regions 10 by shaping the outlet ports with projections, e.g. in the form of needles or depressions.

For this purpose, it is possible to generate the high intensity plasma regions by utilizing a hollow conductive rod to form an anode grounded. In this case, however, since a self-bias potential must be generated, the reaction chamber must be grounded as well as the anode. Furthermore, although the high intensity plasma region may be formed only in a single location, it is effective to form a plurality of such regions particularly in the case that the area of the substrate to be coated is relatively large.

The deposition speed is increased usually by increasing the reaction pressure. When the reaction pressure is elevated, however, the self-bias potential is reduced, as understood from FIG. 3, so that the film thus deposited tends to have a poor density and a low hardness. In accordance with the present invention, the bias potential is maintained by setting the distance of 10 mm or shorter even if the reaction pressure is elevated. As a result, it becomes possible to carry out deposition at a high deposition speed.

Figure 5:
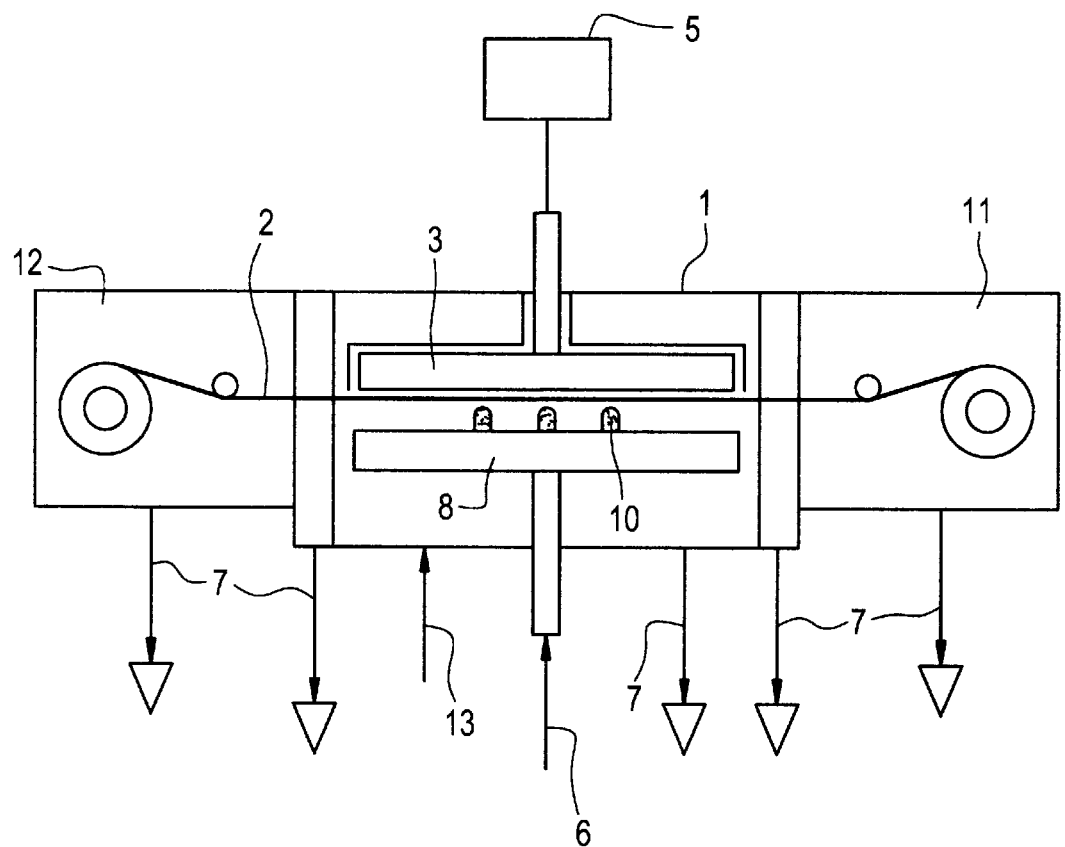
FIG. 5 is a cross sectional view showing an apparatus for forming films on a substrate in accordance with a first embodiment of the present invention.

Referring now to FIG. 5, a plasma vapor deposition apparatus made for the purpose of test and in accordance with a first embodiment of the present invention will be explained. The apparatus comprises a reaction chamber 21, a pair of parallel plates 23 and 28 between which a reaction space is defined, a gas feeding system 26 for supplying a reactive gas to the reaction space, a power supply 5 for applying high frequency electric energy to the reaction gas at 13.56 MHz, an evacuation system 27 for evacuating the exhausted gas from the chamber 21. The parallel plates 23 and 28 are a power supply electrode connected to the power supply and an opposite electrode grounded which are apart from each other by a distance of no wider than 10 mm, preferably no wider than 5 mm which distance is employed from the consideration as set forth above.

Figure 6:
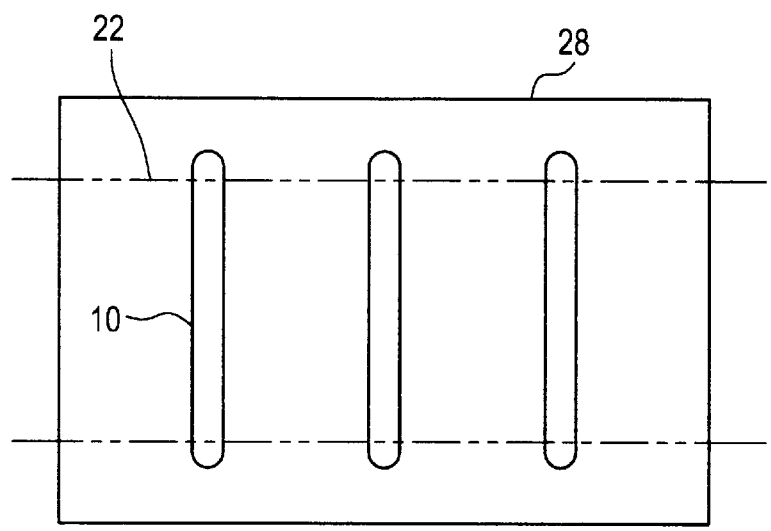
FIG. 6 is a schematic view showing high intensity plasma regions generated in accordance with a first embodiment of the present invention.

The substrate 22 to be coated in this case is provided in the form of a scroll of around a right axis in a substrate feeding chamber 31, unwounded from the right axis for deposition and transferred to and rolled up around a left axis in an enrollment chamber 32. During the travel from the right axis to the left axis, the substrate 22 is skimming just below the power supply electrode (cathode) 23 at 50 m/min. The opposite electrode 28 is provided with three gas feeding slits to form three sheet-like plasma regions 10 in a upright position perpendicular to the transportation direction of the substrate between the electrodes 23 and 28. The sheet-like plasma regions 10 are extending across the substrate beyond the length of the substrate as illustrated in FIG. 6. Whereas a carbon compound gas such as ethylene is supplied through the gas feeding slits as a reactive gas, another gas feeding system is provided to form a flow of hydrogen around the deposition space as designated by numeral 33. The opposite electrode 28 is therefore formed to have a dual channel hollow structure therein to convey the carbon compound gas and hydrogen separately.

The substrate 22 is exposed to hydrogen plasma at the initial stage in the vicinity of the right edge of the electrodes and cleaned by hydrogen radicals or ions to provide a clean surface on which deposition can be carried out in a good condition. At the next stage, the substrate 22 is subjected to carbon plasma and successively coated with a carbon film. Finally, the substrate 22 is exposed again to hydrogen plasma in the vicinity of the left edge of the electrodes. The carbon film is then densified by bombardment of hydrogen ions. As a result, the substrate 22 is successively coated with an excellent carbon film due to the pre-deposition treatment and the post-deposition treatment with hydrogen plasma.

The effect by the treatment with hydrogen plasma was confirmed by repeating the above experiment without introduction of hydrogen. As a result, it was confirmed that the adhesivity of the carbon film formed by this experiment for comparison was inferior to that of the carbon film formed with hydrogen being introduced.

Namely, uniform deposition over a wide area can be realized by transporting the substrate respective to the intensified plasma discharging region extending beyond the length of the substrate. This is guaranteed by the uniformity of the plasma in the transverse direction. Of course, the equivalent technique is expected by transporting the electrodes (plasma generating region) instead of the substrate.

Figure 7:
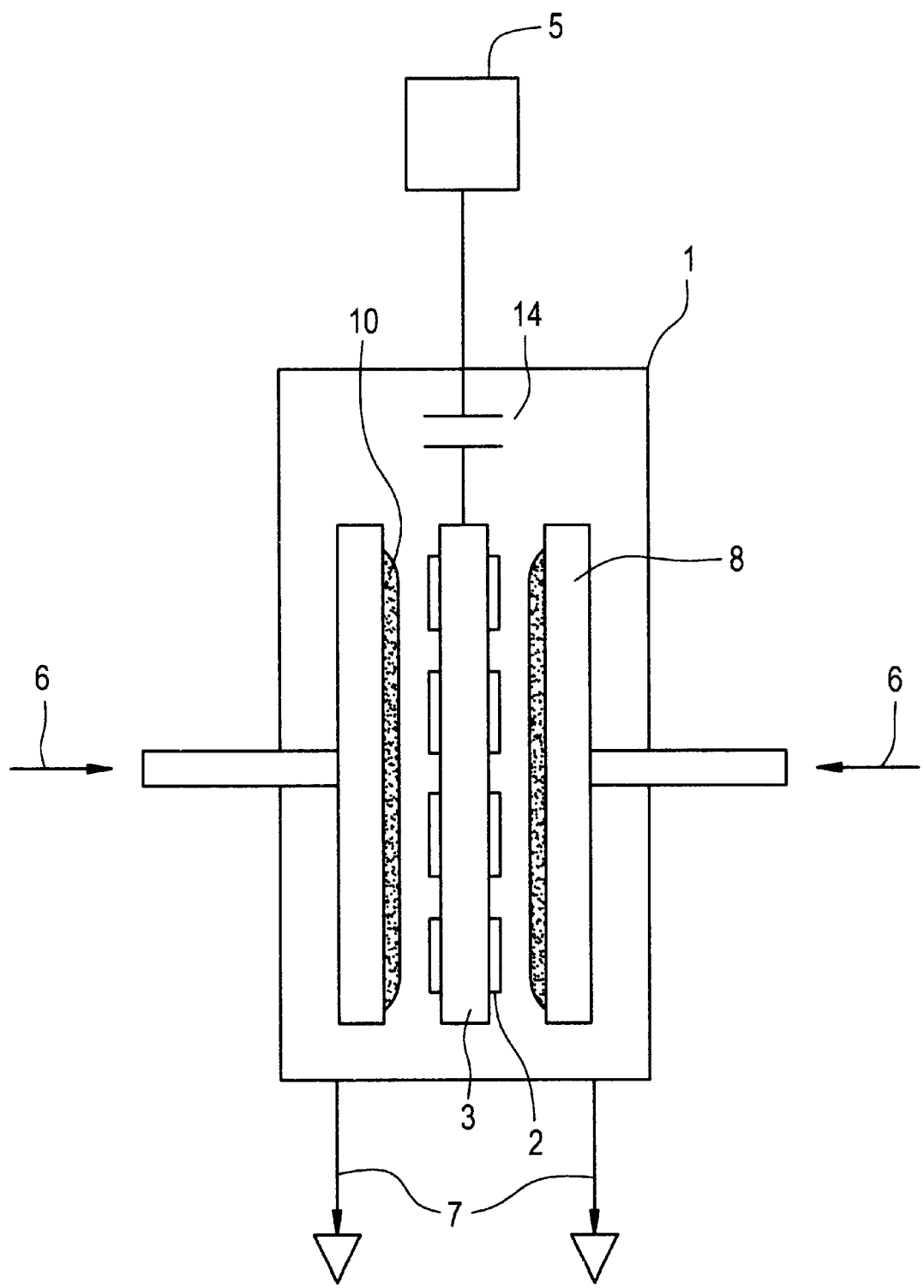
FIG. 7 is a cross sectional view showing an apparatus for forming films on a substrate in accordance with a second embodiment of the present invention.

In FIG. 7 is illustrated an in-line type deposition apparatus for forming carbon films by plasma vapor deposition or sputtering which is modified in accordance with a second embodiment of the present invention. The apparatus comprises a reaction chamber 41, a pair of parallel plates 48 which are grounded as anodes, an intervening parallel plate 43 as a cathode located between the parallel plates 48, a gas feeding system for supplying a reactive gas to the reaction space through the pair of parallel plates 48 as designated by numeral 46, a power supply 5 for applying high frequency electric energy to the reaction gas at 13.56 MHz, an evacuation system 47 for evacuating the exhausted gas from the chamber 1. A pair of reaction or deposition regions are defined between the intervening plate 43 and the pair of the parallel plates 48. The intervening plate 43 functions as a cathode, i.e. a power supply electrode connected to the power supply 35 and also functions as a substrate holder for supporting substrates at positions apart from the respective side parallel plates 48 by a distance of no wider than 10 mm, preferably no wider than 5 mm which distance is employed from the consideration as set forth above. In the case of the illustrated example, 3×4 magnetic disks of 3.5 inches diameter are mounted on each of the opposite sides of the intervening plate. Namely, a dozen of disks can be processed at once on the intervening plate 43.

While usual plasma CVD apparatuses and sputtering apparatuses have relatively simple structure, substrates to be coated have to be mounted on the cathodes for deposition of carbon films in accordance with the present invention so that it is difficult to effectively design the transportation of substrates and the energy supply system. With this structure illustrated in FIG. 6, however, many or wide substrates can be processed at once without difficulties.

The intervening plate 43 functioning as a substrate holder is removed and disposed by means of a suitable transportation mechanism, not shown in the figure, which is composed of rails, racks, mounts, pinions and the like all of which are made of insulating material in order to make the intervening plate 43 to be floating and insulated with respect to direct current. High frequency electric energy is supplied to th(e intervening plate 43 from the power supply 5 through an indirect coupling structure including a vacuum gap 44.

With a carbon compound introduced into the chamber, carbon films were deposited on the 24 magnetic disks. The deposition succeeded without any problem to a thickness of 200 angstroms. Namely, high self-bias potential can be generated even in a high pressure region so that a wide substrate can be coated in a small vacuum chamber. The physical deposition area is formed not over the entirety of the space between the opposite electrodes but formed only localized plasma regions in the vicinity of the gas outlet port. High intensity illumination appears in the plasma regions.

The foregoing description of preferred embodiments has been presented for purposes of illustration and description. It is not intended to be exhaustive or to limit the invention to the precise form described, and obviously many modifications and variations are possible in Light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A plasma CVD method for depositing a film on a substrate comprising the steps of:

introducing a reactive gas into a reaction chamber;

evacuating said reaction chamber;

supplying an electric power to said reactive gas in said chamber to produce a localized plasma of said reactive gas;

supporting a substrate in said reaction chamber to expose a surface of said substrate to said localized plasma wherein a cross section of said localized plasma taken in parallel with a surface of said substrate has an elongated shape extending in one direction; and moving said substrate relative to said localized plasma in a direction orthogonal to said one direction in order to deposit a film over said substrate, wherein a width of said substrate along said one direction is shorter than a length of said cross section along said one direction.

2. The plasma CVD method of claim 1 wherein said reactive gas includes a carbon compound gas and said film comprises carbon.

3. The plasma CVD method of claim 1 wherein said chamber is grounded.

4. A plasma CVD method for depositing a film on a substrate in a chamber having a pair of opposed electrodes, wherein one of said electrodes has an opening, comprising:

introducing a reactive gas into said reaction chamber through said opening in one of said electrodes such that reactive gas is introduced into a space between said electrodes;

evacuating said reaction chamber;

applying a voltage between said electrodes to produce a localized plasma of said reactive gas;

supporting a substrate adjacent the other one of said electrodes to expose a surface of said substrate to said localized plasma wherein a cross section of said localized plasma taken in parallel with a surface of said substrate has an elongated shape extending in one direction; and moving said substrate relative to said localized plasma in a direction orthogonal to said one direction in order to deposit a film on said substrate, wherein a width of said substrate along said one direction is shorter than a length of said cross section along said one direction.

5. The plasma CVD method of claim 1 wherein said reactive gas includes a carbon compound gas and said film comprises carbon.

6. The plasma CVD method of claim 1 wherein said chamber is grounded.

7. The plasma CVD method of claim 4 wherein said electrodes are distant from each other with a gap not larger than 10 mm.

8. A plasma CVD method for depositing a film on a substrate in a chamber having a pair of opposed electrodes, wherein one of said electrodes has an opening that is elongated in a first direction, comprising:

introducing a reactive gas into said reaction chamber through said opening in said electrode such that reactive gas is introduced in a space between said electrodes;

applying a voltage between said electrodes to produce a localized plasma of said reactive gas, said plasma having a width corresponding to the length of said opening and extending between said electrodes in a second direction;

supporting a substrate adjacent the other one of said electrodes so that a surface of said substrate is exposed to said localized plasma, and moving said substrate relative to said localized plasma in a direction orthogonal to said first direction and said second direction.

9. The plasma CVD method of claim 1 wherein said reactive gas includes a carbon compound gas and said film comprises carbon.

10. The plasma CVD method of claim 1 wherein said chamber is grounded.

11. The plasma CVD method of claim 4 wherein said electrodes are distant from each other with a gap not larger than 10 mm.

12. A method of forming a film comprising carbon, comprising the steps of:

preparing a first electrode in a reaction chamber wherein said first electrode has at least one opening which is elongated in a first direction;

connecting an r.f. power source to said first electrode;

preparing a second electrode opposed to said first electrode in said reaction chamber, wherein said second electrode is grounded;

disposing a substrate adjacent to said first electrode;

introducing a reactive gas into said reaction chamber wherein said reactive gas comprises a carbon compound;

applying an r.f. power between said first and second electrodes by said r.f. power source to excite said reactive gas;

depositing a film comprising carbon over a surface of said substrate; and moving said substrate in a direction orthogonal to said first direction.

13. A method according to claim 12 wherein said substrate comprises a magnetic disc.

14. A method according to claim 12 wherein said substrate comprises a magnetic tape.

15. A method according to claim 12 wherein a gap between said first and second electrodes is not greater than 10 mm.

16. A method according to claim 12 wherein said film has a Vickers hardness within 300 to 4000 kg/mm$^2$.

17. A method according to claim 12 further comprising a step of exposing said film to a plasma of hydrogen.

* * * * *

UNITED STATES PATENT AND TRADEMARK OFFICE
CERTIFICATE OF CORRECTION

PATENT NO.   : 6,001,432
DATED        : December 14, 1999
INVENTOR(S)  : Shunpei Yamazaki et al.

It is certified that error appears in the above-identified patent and that said Letters Patent is hereby corrected as shown below:

Column 7,
Lines, 51 and 54, please replace "1" with -- 4 --

Column 8,
Lines 18 and 21, please replace "1" with -- 8 --
Line 23, please replace "4" with -- 8 --

Signed and Sealed this

Thirtieth Day of March, 2004

JON W. DUDAS
*Acting Director of the United States Patent and Trademark Office*